US010594301B1

(12) United States Patent
Heidary Shalmany et al.

(10) Patent No.: US 10,594,301 B1
(45) Date of Patent: Mar. 17, 2020

(54) CLOCK GENERATOR WITH DUAL-PATH TEMPERATURE COMPENSATION

(71) Applicant: SiTime Corporation, Santa Clara, CA (US)

(72) Inventors: Saleh Heidary Shalmany, Delft (NL); Kamran Souri, The Hague (NL); Sassan Tabatabaei, Sunnyvale, CA (US); Uğur Sönmez, The Hague (NL)

(73) Assignee: SiTime Corporation, Santa Clara, CA (US)

( * ) Notice: Subject to any disclaimer, the term of this patent is extended or adjusted under 35 U.S.C. 154(b) by 0 days.

(21) Appl. No.: 16/004,283

(22) Filed: Jun. 8, 2018

Related U.S. Application Data

(60) Provisional application No. 62/517,396, filed on Jun. 9, 2017.

(51) Int. Cl.
  *H03K 3/011* (2006.01)
  *G06F 1/04* (2006.01)

(52) U.S. Cl.
  CPC ............ *H03K 3/011* (2013.01); *G06F 1/04* (2013.01)

(58) Field of Classification Search
  CPC .................................. H03K 3/011; G06F 1/04
  USPC ............... 327/291, 292, 299, 378, 512, 513
  See application file for complete search history.

(56) References Cited

U.S. PATENT DOCUMENTS

| | | | | |
|---|---|---|---|---|
| 5,451,892 A | * | 9/1995 | Bailey ..................... | G06F 1/206 327/113 |
| 6,420,938 B1 | * | 7/2002 | Hoff ....................... | H03L 1/022 331/116 R |
| 7,212,076 B1 | * | 5/2007 | Taheri .................... | H03B 5/368 331/177 V |
| 2003/0067361 A1 | * | 4/2003 | Takahashi .............. | H03L 1/025 331/176 |
| 2005/0012561 A1 | * | 1/2005 | Young .................... | H03L 1/022 331/176 |
| 2014/0091868 A1 | * | 4/2014 | Ishikawa ................ | H03B 9/145 331/107 DP |
| 2014/0361844 A1 | * | 12/2014 | Quevy .................... | H03B 5/30 331/70 |

\* cited by examiner

*Primary Examiner* — Tomi Skibinski

(57) ABSTRACT

In a timing signal generator having a resonator, one or more temperature-sense circuits generate an analog temperature signal and a digital temperature signal indicative of temperature of the resonator. First and second temperature compensation signal generators to generate, respectively, an analog temperature compensation signal according to the analog temperature signal and a digital temperature compensation signal according to the digital temperature signal. Clock generating circuitry drives the resonator into mechanically resonant motion and generates a temperature-compensated output timing signal based on the mechanically resonant motion, the analog temperature compensation signal and the digital temperature compensation signal.

21 Claims, 7 Drawing Sheets

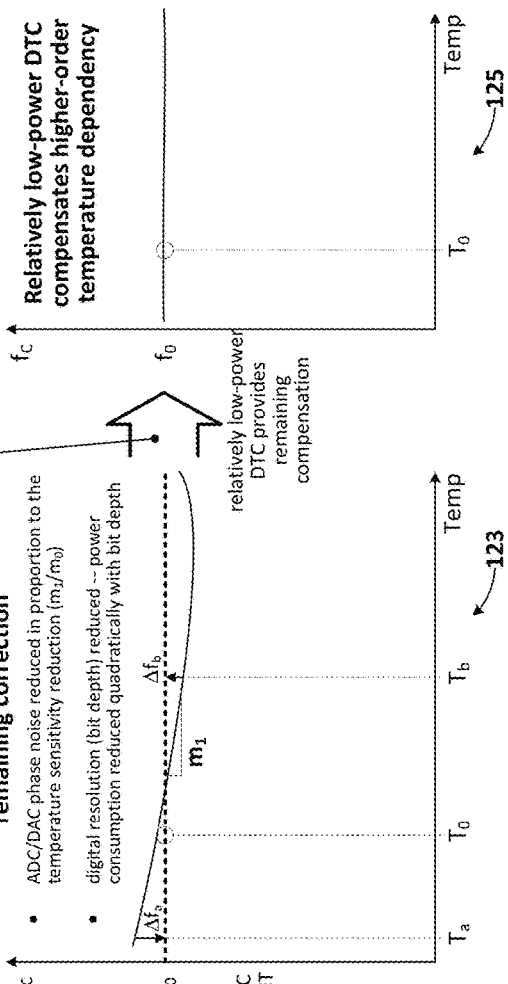
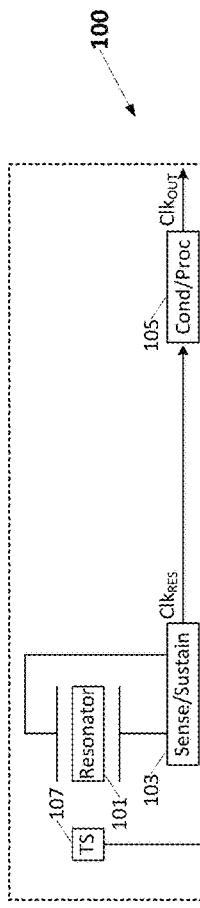
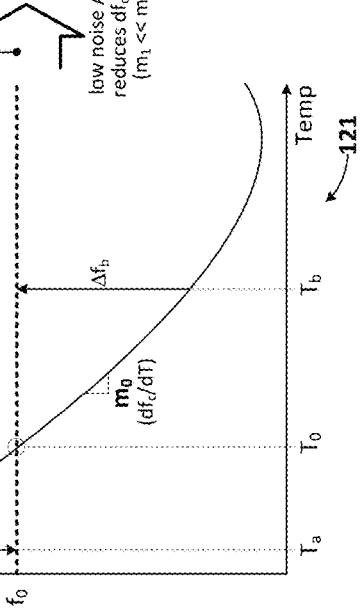
FIG. 1

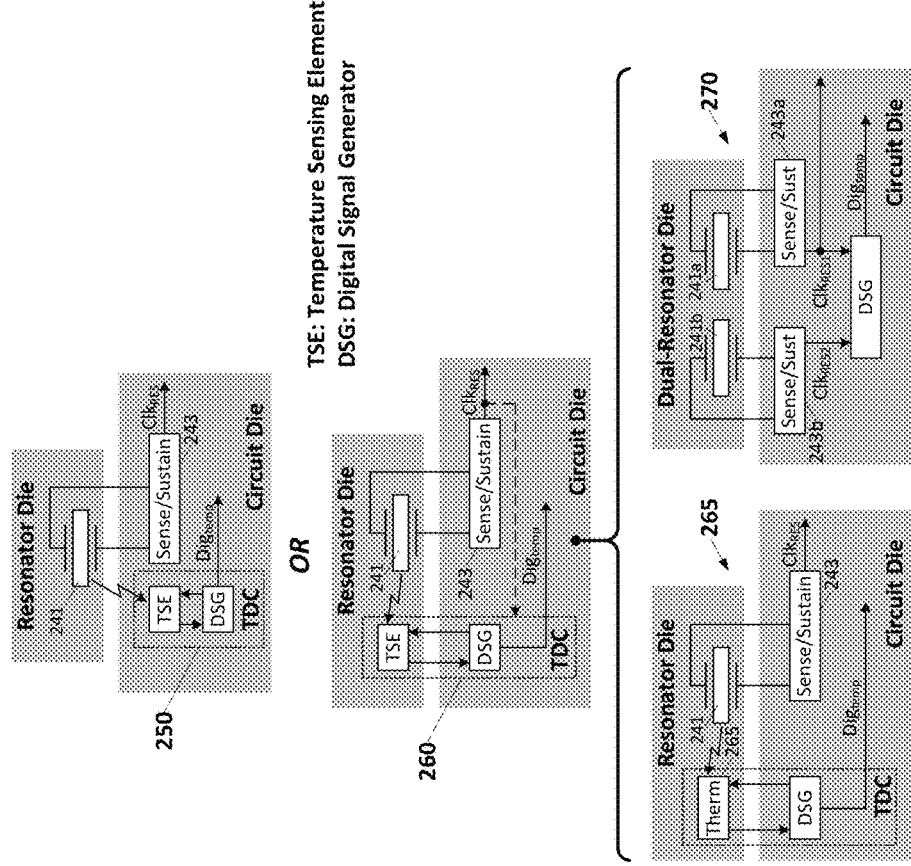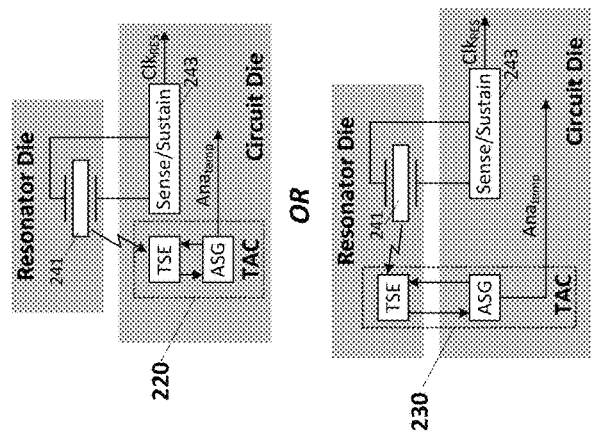

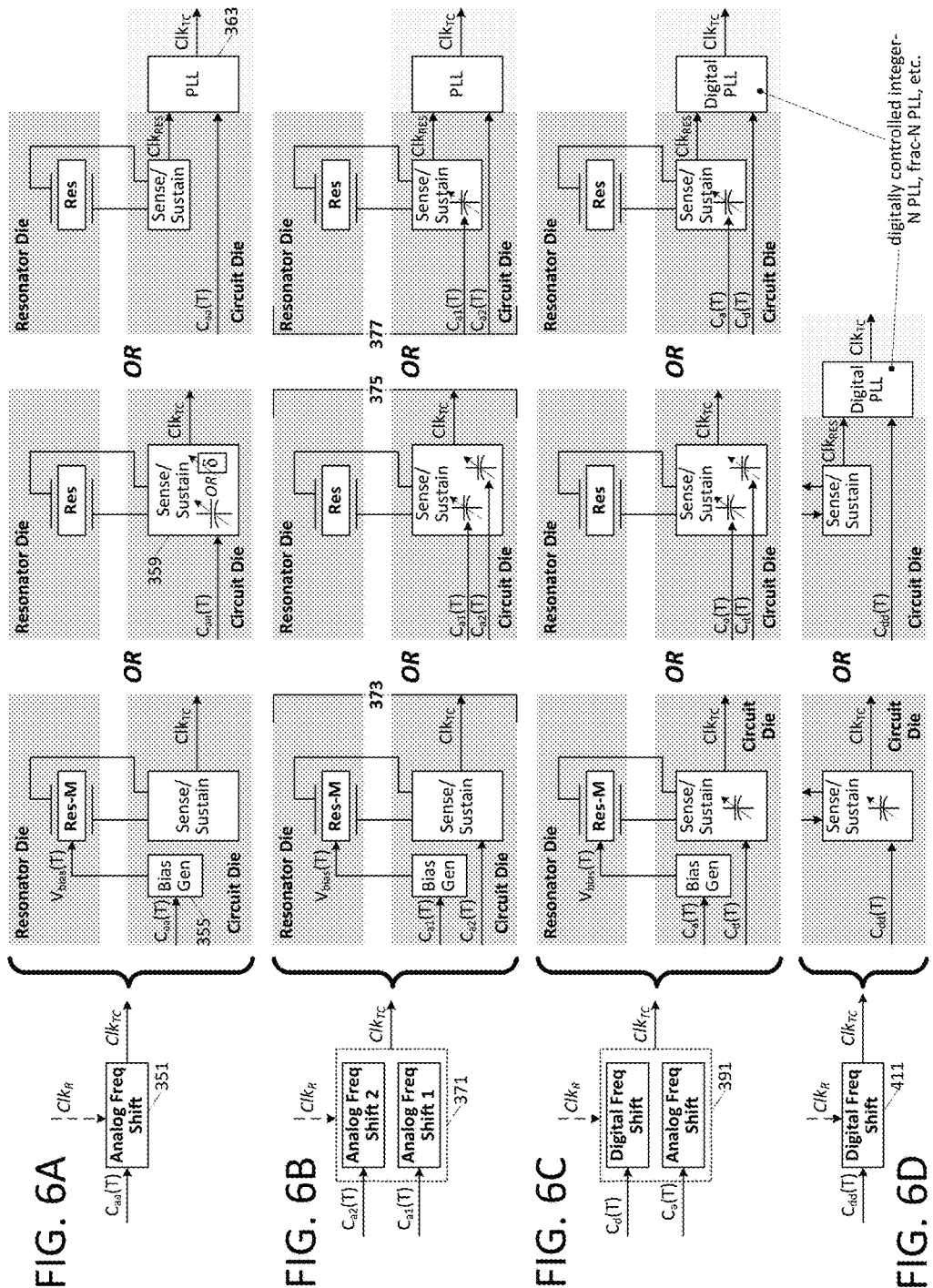

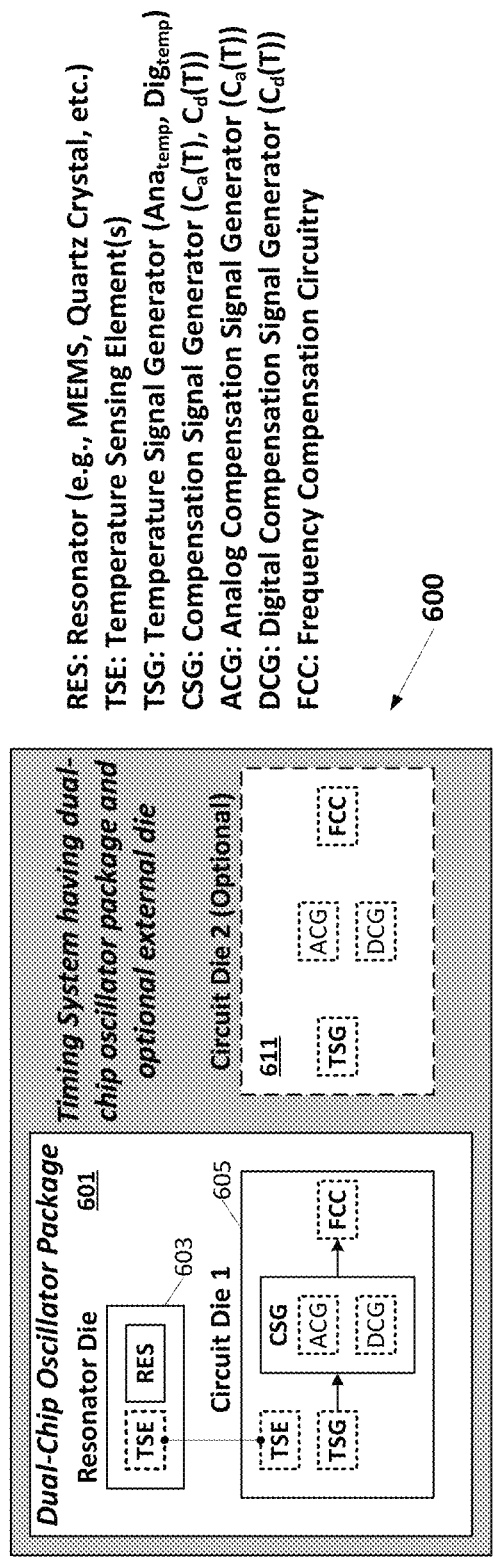
FIG. 9   Multi-Chip Timing Signal Generator with Dual-Path Temperature Compensation

CLOCK GENERATOR WITH DUAL-PATH TEMPERATURE COMPENSATION

CROSS REFERENCE TO RELATED APPLICATIONS

This application hereby claims priority to and incorporates by reference U.S. Provisional Patent Application No. 62/517,396 filed Jun. 9, 2017 ("Hybrid Temperature Compensation").

TECHNICAL FIELD

The disclosure herein relates to high precision timing devices.

INTRODUCTION

Resonator elements in high-precision timing circuits generally exhibit temperature-dependent frequency drift that may be countered by active compensation circuitry. As frequency-stability requirements tighten, however, conventional temperature compensation approaches are increasingly inadequate. Modern digital compensation techniques (developed to overcome limited precision of older analog compensation approaches), for example, are running out of headroom as the increased bit depths necessary to meet ever-increasing stability requirements are driving phase noise and power consumption to insupportable levels.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a resonator-based timing signal generator having dual temperature compensation paths;

FIG. 3 illustrates embodiments of temperature-to-analog converters that may be implemented within a two-die oscillator;

FIG. 4 illustrates embodiments of temperature-to-digital converters that may be implemented within a two-die oscillator;

FIGS. 6A-6D illustrate various frequency compensation circuit embodiments corresponding to the single-point correction and dual-point correction alternatives shown in FIG. 2;

FIG. 9 illustrates various component circuit dispositions within a multi-chip timing signal generator having dual-path temperature compensation according to any of the embodiments discussed herein.

DETAILED DESCRIPTION

Figure 2:
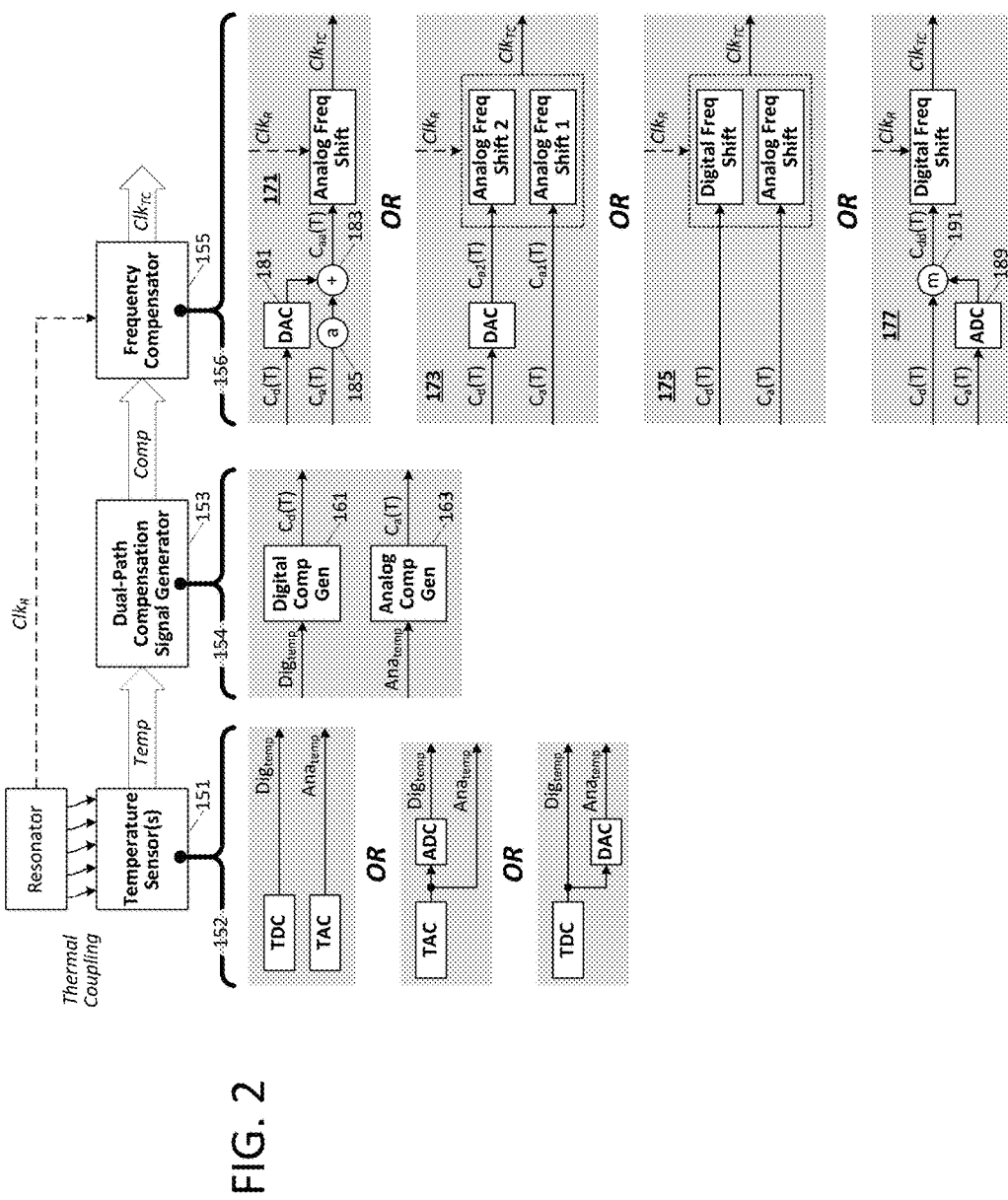
FIG. 2 illustrates exemplary components of the dual temperature-compensation paths in FIG. 1, non-exhaustively showing alternative architectures for each.

In various embodiments disclosed herein, a resonator-based timing signal is temperature-compensated by two distinct compensation paths—a low-noise analog path that produces an analog compensation signal corresponding to low-order temperature-dependent frequency drift, and a nonlinear digital path that produces a digital compensation signal corresponding to higher-order temperature-dependent frequency drift. In a number of such "dual-path" or "hybrid" temperature compensation approaches, analog-path temperature compensation substantially reduces the dynamic range required in the digital path (i.e., as compared to fully digital solutions) to compensate residual frequency-temperature dependence, substantially lowering phase noise and power consumption without compromising frequency stability.

FIG. 1 illustrates an exemplary clock generator 100 (or timing signal generator) having a resonator 101, sense/sustain circuitry 103, optional conditioning/processing circuitry 105 and dual or split temperature compensation paths, one having digital temperature compensation signal generator 115 and the other having analog temperature compensation signal generator 117. In a number of embodiments herein, resonator 101 is a microelectromechanical (MEMS) resonator (e.g., a resonant structure lithographically formed within a layer of silicon or other semiconductor material), though a quartz resonator or any other mechanically resonant structure that exhibits temperature-dependent frequency drift may be deployed instead. Sense/sustain circuitry 103 drives resonator 101 into one or more mechanical resonance modes and senses the resonant motion to produce a resonator clock signal ($Clk_{RES}$)—the sense/sustain circuitry and resonator thus collectively forming an oscillator. Optional conditioning/processing circuitry 105 receives the resonator clock and performs one or more signal conditioning or processing operations (e.g., frequency multiplying or dividing, phase-shifting, duty cycle adjust, etc.) to produce an output clock ($Clk_{OUT}$).

Despite discussion in the general context of mechanically resonant structures and related circuitry, dual-path temperature compensation techniques presented herein may be deployed more generally in combination with any oscillator (e.g., mechanically or optically resonant structure, or electrical counterpart such as an LC, RC or RLC circuit, ring oscillator, etc.) for which it may be beneficial or desirable to adjust (or correct, shift or otherwise change) output frequency as a function of temperature. Examples of alternative temperature-compensated oscillators include, without limitation, optically resonant structures and various electrically resonant circuits (e.g., LC or RLC circuits, ring oscillators, etc.).

The dual temperature compensation paths include one or more temperature sensors 107 and associated circuitry that generate analog and digital measures of resonator temperature, $Ana_{temp}$ and $Dig_{temp}$ (i.e., sensing the resonator temperature directly or sensing ambient temperature); aforementioned digital and analog temperature-compensation signal generators 115 and 117 to produce compensation signals $C_d(T)$ and $C_a(T)$, respectively; and one or more frequency compensation circuits or circuit elements to which the compensation signals are applied to adjust or shift the frequency of $Clk_{RES}$ and/or $Clk_{OUT}$ as a function of temperature. As discussed below, such "frequency compensator" circuits or circuit elements may be disposed in whole or part within sense/sustain circuitry 103 (including resonator biasing circuitry if present) and/or conditioning/processing circuitry 105 and thus are not specifically depicted in FIG. 1. Also, in a number of embodiments presented below, the frequency compensation operations cancel (correct for, mitigate, attenuate, eliminate, etc.) temperature-dependent frequency drift to the maximum practicable extent so as to yield a resonator clock or output clock having exceedingly low temperature dependence (or, stated affirmatively, a temperature-stable or temperature-insensitive clock), for example, on the order of 10 parts per billion (ppb) per degree Celsius or less over a ~180 degree operating range (e.g., −55° C. to 125° C.) and thus a sub-part-per-million (sub-ppm) frequency change over that operating range. In all such embodiments, the frequency compensation may alternatively yield a non-zero temperature dependency according to any desired profile (e.g., idealized-linear, quadratic or other polynomial or analytical mapping).

Still referring to FIG. 1 and assuming that the oscillator implemented collectively by resonator 101 and sense/sustain circuitry 103 exhibits a temperature dependency profile as shown at 121 and further assuming an objective temperature stability improvement of at least four orders of magnitude (for example, at least 1E4), the aforementioned challenges with respect to single-path temperature compensation arise. Namely, the nonzero higher-order temperature-coefficient of frequency (TCF) terms exhibited by the temperature-dependency profile (e.g., significant quadratic, cubic or higher order TCFs) are difficult to compensate in a low-noise/low-power analog solution, whereas the high dynamic range required in a digital solution generally requires an impractically high bit depth in terms of phase noise and power consumption. For example, assuming a single-crystal silicon resonator that exhibits a −40 ppm/° C. temperature dependency (i.e., oscillator output frequency $f_C$ drops, on average over a desired operating temperature range, by 40 parts per million per degree Celsius), then compensating to yield a 1 ppb/° C. profile (or less) will require a bit depth of $\log_2 (4*10^4)=16$ bits; a bit depth that drives up phase noise (i.e., cycle-to-cycle jitter in clock phase), circuit area and/or power consumption to levels unacceptable for many applications. By contrast, in the dual-path compensation approach, a low-noise analog compensation reduces (cancels, mitigates, attenuates, etc.) at least first-order temperature dependence so that the slope of the residual frequency error (i.e., residual temperature dependency) is dramatically flattened, relaxing/reducing the dynamic range required for remaining correction and thus enabling digital compensation of the residual frequency-temperature dependence without undue phase noise or power consumption. Phase noise resulting from digital temperature generation, for example, is roughly proportional to the product of first-order frequency-dependence and temperature-to-digital conversion (TDC) noise (i.e., $PN_{TDC} \propto \sigma_{TDC}*df_C/dT$, where $PN_{TDC}$ is phase noise at a given frequency offset, $\sigma_{TDC}$ is TDC noise, and denotes multiplication) and is accordingly reduced in proportion to the first-order temperature-dependency reduction (i.e., in proportion to the reduction of the slope of the temperature dependency profile and thus by a factor of mi/mo), while TDC power consumption is quadratically reduced. Continuing with the −40 ppm/° C. to 1 pbb/° C. stability-improvement example, for instance, a 40:1 reduction in temperate-dependency slope effected via the analog temperature compensation (ATC) path reduces the bit-depth required in the digital compensation path (including TDC, digital-compensation signal generation and/or digital frequency correction circuitry) from ~16 bits to ~10 bits or less, thereby enabling relatively low-power, low-noise compensation of higher-order temperature compensation dependency. More generally, n-bit reduction in digital path bit-depth (e.g., in the TDC, digital compensation signal generator and/or digital frequency compensation circuit) reduces digital path power consumption by $\sim 2^{2n}$—below the analog-path power floor in many cases, so that the low-power analog path effectively sets the power consumption level for the dual-path temperature compensation as a whole. For example, if, for a given stability-improvement target, power consumption in the analog compensation path is lower than that of an all-digital solution by 20×, then reduction of the digital-path bit-depth by more than two bits effectively reduces the overall dual-path power consumption to that of the analog compensation path alone and thus by ~20×.

Still referring to FIG. 1, the dual temperature compensation operations are generally commutative and thus may be carried out in either order or in parallel. For example, despite the left-to-right analog and then digital compensation sequence depicted in the temperature-dependency waveforms (yielding intermediate profile 123, at least conceptually, and then final profile 125), digital temperature compensation (DTC) may be carried out prior to or concurrently with analog temperature compensation (ATC) to achieve the desired temperature stability improvement without excessive phase noise or power consumption.

FIG. 2 illustrates exemplary components of the dual temperature-compensation paths in FIG. 1, non-exhaustively showing alternative architectures for each. More specifically, one or more temperature sensors and related circuitry (collectively, 151) yield analog and digital temperature signals corresponding to a resonator element (e.g., the sensor(s) being thermally coupled to the resonator through colocation and/or thermally-conductive material disposition), dual-path compensation signal generator 153 produces analog and digital temperature-compensation signals ($C_a(T)$, $C_d(T)$) in response to the analog and digital temperature signals, respectively, and frequency compensator 155 adjusts, shifts, corrects or otherwise changes the frequency of a resonator-dependent clock signal $Clk_R$ based on the analog and digital temperature-compensation signals. As shown, by architectural variants 152, temperature sensor circuitry 151 may include separate temperature-to-digital and temperature-to-analog converters (TDC and TAC, respectively—digital and analog transducers) to generate digital and analog temperature signals $Dig_{temp}$ and $Ana_{temp}$, respectively, or a single analog transducer or single digital transducer may be provided together with analog-to-digital conversion (ADC) circuitry or digital-to-analog conversion (DAC) circuitry to produce the counterpart (analog or digital) temperature signal based on the transducer output. Although any of the depicted architectures may be deployed, the dual transducer (separate TDC and ADC) and analog single-transducer (TAC followed by ADC to generate $Dig_{temp}$) embodiments most directly enable reduced TDC bit depth relative to conventional digital compensation approaches. Where the analog compensation path reduces the requisite digital bit-depth from N bits to M bits, for example, bit-depth within the TDC in the dual-sensor architecture (separate TDC and TAC) may be correspondingly decreased by N-M bits (proportionally lowering TDC noise and quadratically lowering TDC power consumption), and the bit-depth of the ADC within the TAC-only architecture may likewise be lowered by N-M bits. In general, the TDC within the digital-transducer-only architecture is implemented with sufficient bit depth to support the full compensation range of the combined digital and analog compensation paths (i.e., full dynamic range of overall stability improvement), but, even in that case the requisite bit depth in the digital temperature signal delivered to the dual-path compensation signal generator may be relaxed—that is, the digital compensation signal generator may still operate on a reduced bit-depth digital temperature signal (e.g., M least significant bits thereof) and thus reduce phase noise and/or power consumption relative to conventional single-path compensation approaches.

In the conceptual architecture of FIG. 2, dual-path compensation signal generator 153 is implemented by separate (discrete) digital and analog compensation signal generators 161 and 163 (i.e., as shown at 154) that independently produce digital and analog temperature compensation signals $C_d(T)$ and $C_a(T)$, respectively, according to incoming digital and analog temperature signals. In alternative embodiments, the otherwise separate analog and digital compensation signal generators may interact with one another in various ways. For example, as part of compensation signal generation, analog compensation signal generator 163 ("analog generator") may output an analog or digital range-select value to digital compensation generator 161—a value that may be applied within the digital compensation signal generator ("digital generator") to select between different digital compensation lookup tables, select between different analytical expressions, and/or qualify (modify in some way) the output of a lookup table or analytical expression as part of Cd(T) generation. Conversely, digital generator 161 may supply an analog or digital value to analog generator 163 to be applied therein to trim, scale, select (e.g., between different analog compensation signal generation circuits or circuit elements) or otherwise impact analog compensation signal generation.

Still referring to FIG. 2, frequency compensator 155 may be implemented as shown at 156 either by dual point-of-correction (DPC) architectures 173 and 175, or single point-of-correction (SPC) architectures as shown at 171 and 177. Considering the single correction-point (SPC) architectures first, an analog or digital frequency-shift (or frequency-adjust or frequency-correction) circuit shifts the frequency of the resonator-dependent clock signal ($Clk_R$) in accordance with a merged analog or digital compensation signal $C_{aa}(T)$ or $C_{dd}(T)$. In the SPC analog frequency-shift architecture (171), DAC 181 converts the incoming digital compensation signal $C_d(T)$ to an analog equivalent which is then summed, multiplied or otherwise combined with the incoming analog signal in merge element 183 to produce $C_{aa}(T)$. One or more analog gain elements 185 may be disposed in the analog input path and/or post-DAC digital path to provide relative gain between the merged analog correction signal components. The analog frequency shift circuit itself may be implemented as part of the oscillator (i.e., resonator in combination with sense/sustain circuitry) or within post-oscillator conditioning/processing circuitry—options discussed below in greater detail.

SPC digital frequency shift architecture 177 operates comparably to the SPC analog architecture, but with ADC 189 to effect signal in the converse direction (i.e., from analog to digital) to yield a digital compensation signal that is combined with $C_d(T)$ within digital merge element 191 (e.g., summing circuit, multiplying circuit, bit-merge circuit, etc.) to deliver compensation signal $C_{dd}(T)$ to a digital frequency shift circuit.

In dual correction-point (DPC) architectures 173 and 175, each of the analog and digital temperature compensation signals is applied to a respective one of two frequency-shift circuits or elements—either two analog frequency-shift circuits as in architecture 173 respective analog and digital frequency shift circuits (architecture 175) or two digital frequency-shift circuits (not specifically shown). In either of the homogenous frequency-shift architectures (i.e., two analog or two digital frequency shift circuits as opposed to the hybrid digital and analog architecture 175), the digital or analog temperature compensation signal is converted to the counterpart domain (i.e., via DAC as shown in architecture 173 or ADC in a dual-digital frequency compensator embodiment), and gain or other conditioning elements may be provided in either of the digital (including post DAC) or analog temperature compensation paths.

FIG. 3 illustrates embodiments of temperature-to-analog converters (TACs) 220 and 230 that may be implemented within a two-die oscillator. In each embodiment, the oscillator includes a resonator die (i.e., having a resonator element 241 and sense/drive electrodes) and a circuit die having sense/sustain circuitry 243 coupled to sense/drive electrodes within the resonator die. In a number of implementations the two dies are stacked in various configurations (flip-chip, underside-mount, etc.) to firm a single multi-die integrated circuit, in some cases with the circuit die (e.g., a complementary metal oxide semiconductor (CMOS) die) serving as a lid to seal the resonator within a cavity or chamber of the resonator die. The temperature-to-analog converter in each embodiment includes a temperature-sensitive element (TSE) and analog signal generator circuitry (ASG) that interact to produce an analog temperature signal representative of resonator temperature. In embodiment 230, the temperature-sensitive element (e.g., thermistor (including a MEMS thermistor), PN-junction-based element or any other practicable on-chip temperature sensitive element) is disposed in relatively close proximity to resonator 241 to achieve a tight thermal coupling between those two elements and thus enable relatively direct sensing of resonator temperature (or ambient temperature of resonator die, temperature within resonator cavity, etc.). In embodiment 220, the temperature-sensitive element is disposed within the circuit die—an arrangement that lengthens the thermal path between resonator and sensing element, but facilitates potentially more diverse temperature-sensing circuit implementations (e.g., temperature sense elements formed by one or more MOS transistor elements). In either embodiment (220, 230), thermally conductive material or elements (e.g., doped regions or other thermally-conductive materials disposed within resonator die, circuit die and/or inter-die material fill) may be provided to increase thermal coupling between resonator 241 and the temperature-sensitive element. Also, the analog signal generator (ASG) in either embodiment (220, 230) may deliver and receive signals to/from the temperature-sensitive element as necessary to transduce a sensed temperature into an analog temperature signal ($Ana_{temp}$). For example, in the case of a thermistor TSE, the analog signal generator may include one or more passive or active resistive components interconnected with the thermistor to produce the analog temperature signal (e.g., effecting voltage divider with thermistor component, with or without linearizing output stage). More generally, any practicable temperature sensitive element and analog signal generation circuitry may be provided within embodiments 220 and 230 to produce an analog temperature signal. Also, as with all analog signals referred to herein, the analog output (i.e., signal that is continuous over a signal range of interest, as opposed to a quantized digital signal) may be conveyed as a voltage, current and/or temporal quantity (e.g., in the latter case, a phase shift, frequency shift, delay duration or the like).

FIG. 4 illustrates embodiments of temperature-to-digital converters (TDCs) that may be implemented within a two-die oscillator. As in the FIG. 3 embodiments, the temperature sensitive element may be implemented either in resonator die ("Resonator die") or circuit die ("Circuit die") and those two dies may be physically disposed and interconnected according to any of the arrangements discussed above. Also, in both embodiments, a digital signal generator (DSG) within the circuit die is interconnected to a temperature-sensitive element (TSE) in a manner that enables temperature-dependent digital signal generation (i.e., transducing a measure of temperature directly to a digital/quantized signal), even where the temperature sensitive element itself exhibits an analog (continuous) temperature-dependent behavior (e.g., temperature-dependent resistance as in the case of a thermistor element). As an example, in a digitally controlled loop that iteratively adjusts a digital control value for a switched-capacitor or switched-resistor network to impedance-match a thermistor TSE, the digital control word may be output with or without filtering as the digital temperature signal ($\text{Dig}_{temp}$). A switched-capacitor network or switched-resistor network having a switching-frequency-dependent impedance may also serve as the temperature sensitive element, with the resonator clock ($\text{Clk}_{Res}$) or a timing signal derived therefrom serving as the network switching signal (note that such switched-capacitor/switched-resistor TSE may also be implemented within embodiments 220 and 230 of FIG. 3).

Still referring to FIG. 4 and more specifically to inter-die TDC embodiment 260, the temperature sensitive element may be implemented by, for example, a MEMS thermistor ("Therm") as shown in oscillator embodiment 265, or by a dual resonator arrangement—for example two MEMS resonators (241*a* and 241*b* as shown in oscillator embodiment 270) having disparate temperature dependency. In dual-resonator embodiment 270, a digital measure of the frequency difference between resonators 241*a* and 241*b* (coupled respectively to sense/sustain circuits 243*a* and 243*b* to yield clock signals $\text{Clk}_{RES1}$ and $\text{Clk}_{RES2}$) may serve directly or after further processing (e.g., filtering or look-up table) as digital temperature signal, $\text{Dig}_{temp}$. In one embodiment, for example, open-loop or closed-loop cycle-counting circuitry generates a cycle-count difference (difference between cycle counts for respective resonators 241*a* and 241*b*) at regular or approximately regular intervals—a value that itself may be exported as the digital temperature value (e.g., after filtering in a finite impulse-response or infinite impulse-response filter) or that may be applied in a digital temperature value lookup or digital temperature value calculation.

Figure 5:
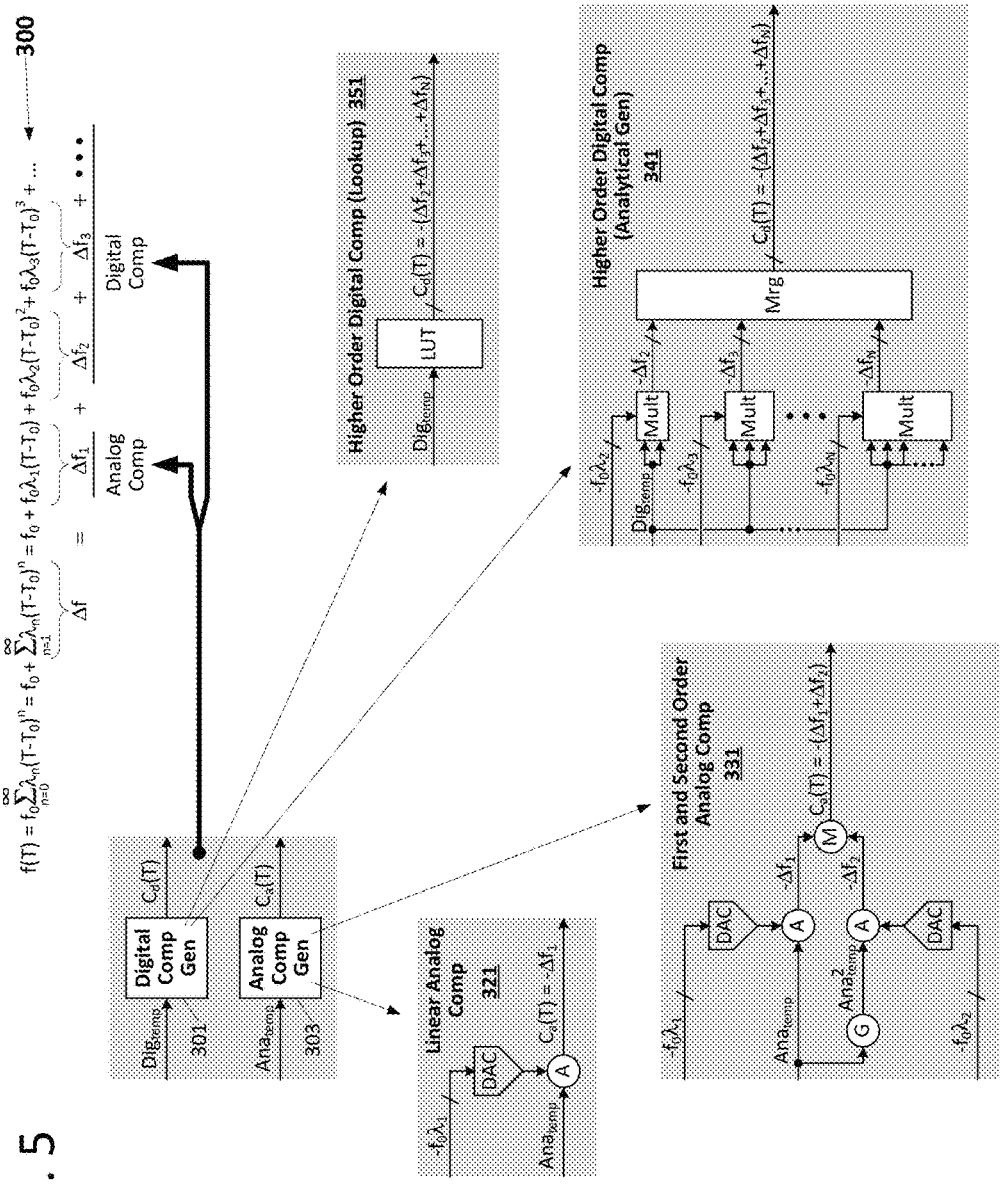
FIG. 5 illustrates embodiments of analog and digital compensation signal generators that may be used to implement like-named components within the dual-path compensation signal generator shown in FIG. 2.

FIG. 5 illustrates embodiments of analog and digital compensation signal generators that may be used to implement like-named components within the dual-path compensation signal generator shown in FIG. 2. In general, the depicted embodiments generate temperature compensation signals in accordance of a polynomial expression 300 corresponding to the temperature-dependency profile of the resonator and in which temperature-coefficients of frequency (TCF) of ascending order $\lambda_n$ (where 'n' ranges from 1 to infinity) are predetermined (e.g., from empirical observation, analytical result, or otherwise) and provided as products with target-frequency ($f_0$) to digital and analog compensation signal generators 301 and 303. In the FIG. 5 embodiments, for instance, predetermined $f_0 * \lambda_n$ values are recorded digitally in non-volatile storage within one or more circuit dies comprised by or associated with a clock generator and supplied to temperature multipliers within the analog and digital compensation signal generators. In exemplary embodiments 321 and 331 of analog compensation signal generator 303, each frequency-TCF product is converted to analog form—a static/one-time conversion within a digital-to-analog conversion circuit (DAC) and thus negligible ongoing power consumption—and then applied as a multiplier coefficient (e.g., gain control) with respect to an incoming frequency term within an amplifier cell (A). In linear analog compensation signal generator 321, a single first-order frequency correction term, $-\Delta f_1$ (analog temperature multiplied by static coefficient $-f_0\lambda_1$) is output from solitary amplifier cell (A) as analog compensation signal, $C_a(T)$. In first- and second-order analog compensation signal generator 331, first- and second-order frequency correction terms, $-\Delta f_1$ and $-\Delta f_2$, are output from respective amplifier cells (A), then summed or otherwise combined within merging circuit (M) to produce analog compensation signal $C_a(T)$. In that case, the first-order compensation term is generated as in embodiment 321, while the second order term is generated by scaling a temperature-square value (analog temperature multiplied with itself in gilbert cell G or other analog-signal multiplier) according to static frequency-temperature product $-f_0\lambda_2$ (e.g., after digital-to-analog conversion of a digitally recorded value of that product). Higher order analog compensation terms may be generated in alternative embodiments (e.g., multiplying the output of gilbert cell G with the analog temperature input to yield a cubic or higher-order temperature multiplier).

Digital compensation signal generator 341 (an exemplary instance of digital generator 301) generates compensation signal $C_d(T)$ through analytical production of higher-order frequency compensation terms (e.g., order=m+1 to N, where 'm' is the highest order compensation term generated within analog compensation signal generator 303). In the particular example shown, digital compensation signal generator 341 generates second-order (quadratic) frequency compensation terms and above, in each case performing a digital multiplication ("Mult") of the pertinent coefficient ($-f_0\lambda_2$ to $-f_0\lambda_N$) with a corresponding number of instances of the digital temperature input, $\text{Dig}_{temp}$ (i.e., $\text{Dig}_{temp}^2$, $\text{Dig}_{temp}^3$, ... $\text{Dig}_{temp}^N$). The individual digital frequency error terms are merged (digitally summed or otherwise combined within circuit "Mrg") to yield the final digital compensation signal, $Cd(T)$. Digital compensation signal generator 351 follows a different approach, looking up a predetermined $C_d(T)$ value in lookup table "LUT" accordance with the incoming digital temperature rather than analytically producing the compensation value.

Still referring to FIG. 5, the reduced digital-path bit-depth afforded by the dual-path compensation approach dramatically lowers power consumption, circuit area and switching noise in each of the digital compensation signal generator alternatives—reducing lookup memory size by a factor of $2^x$ (where 'x' is the bit-depth reduction) in lookup embodiment 351, and reducing computational/combinatorial circuitry required in analytical embodiment 341. Thus, even where full digital bit-depth (i.e., according to the net dynamic range of the frequency stability improvement) is applied/required in the temperature sensor (front-end circuitry) and/or frequency compensator (back-end circuitry), power and noise reduction may still be achieved through dual-path generation of analog and digital temperature compensation signals. Also, while the analog and digital compensation signal generators shown in FIG. 5 operate on polynomial correction principals (e.g., multiplying discrete coefficients with $n^{th}$-order temperature values and then summing those products), any other practicable signal generation approaches may be employed (e.g., spline-based or other piecewise polynomial modeling) in alternative embodiments. Also, scaling and/or nonlinearity in the back-end application of the compensation signals (e.g., squaring effect in resonator-bias-based frequency compensation) may be accounted for in the compensation signal generation. Further, the TCF terms (polynomial order) corresponding to the digital and analog compensation signals may be reversed (e.g., digital compensation predominantly low order, analog compensation predominantly high order), interleaved, or otherwise varied relative to the depicted examples. For example, any analog temperature compensation approach that reduces the slope of frequency shift over temperature may be employed to reduce the bit-depth and complexity required in the digital compensation path (and thus reduce digital-path phase noise and power consumption).

FIGS. 6A-6D illustrate various frequency compensation circuit embodiments corresponding to the single-point correction (SPC) and dual-point correction (DPC) alternatives shown in FIG. 2. In SPC analog embodiment 351 of FIG. 6A, a merged analog compensation signal $C_{aa}(T)$ is applied to:

- a bias signal generator 355 within the circuit die of a two-die oscillator—varying the bias applied to MEMS resonator element (Res-M within resonator die) according to $C_{aa}(T)$ and thus shifting the frequency of $Clk_{TC}$;
- a continuously variable capacitance or delay element within sense/sustain circuit 359 of an oscillator circuit die (e.g., within a Pierce, Colpitts or other practicable resonator-based oscillator circuit)—shifting the resonator frequency and thus $Clk_{TC}$ to zero the phase around a loop; or
- a continuously variable capacitance or delay element within a phase-locked loop (PLL) 363, delay-locked loop (DLL), injection-locked oscillator (ILO), multiplying injection-locked oscillator (MILO) or other clock multiplier or conditioning circuit implemented within the circuit die of a two-die oscillator or in whole or part within another circuit die—shifting the frequency of the clock signal ($Clk_Tc$) output from the PLL/DLL or other conditioning circuit.

In DPC analog embodiment 371 of FIG. 6B, analog compensation signals $C_{a1}(T)$ and $C_{a2}(T)$, each received from a respective compensation signal generator (with $C_{a2}(T)$ being an analog-to-digital conversion of $C_d(T)$), are applied to respective frequency compensation circuits within the circuit die and/or within the circuit die and a separate die. In implementation 373, for example, the two analog compensation signals are supplied respectively to a bias generator and sense/sustain circuit (e.g., variable capacitance or delay element in the latter case) within the circuit die of a two-die oscillator, while, in implementation 375, the two compensation signals are applied to respective variable capacitance elements or delay elements (or one of each) within a sense/sustain circuit of the circuit die. In implementation 377, one of the two compensation signals is supplied to a variable capacitance (or delay element) within a sense/sustain circuit of the circuit die, while the other is applied to a variable capacitance or delay element within a PLL, DLL, ILO, MILO or other conditioning circuit implemented within that same circuit die or in whole or part within a separate die. Though not specifically shown, two different compensation circuits may be implemented in the PLL/DLL/ILO/MILO/conditioning circuit. Also, in call cases, application of compensation signals $C_{a1}(T)$ and $C_{a2}(T)$ to specific compensation circuits/elements may be transposed.

In the analog/digital hybrid DPC embodiment of FIG. 6C, digital compensation signal $C_d(T)$ is applied to a digital frequency compensation circuit (or circuit element), while analog compensation signal Ca(T) is applied to an analog frequency compensation circuit/element. In general, compensation circuit locus within the clock generating system corresponds to the various options shown and described in reference to FIG. 6B (i.e., one each within bias generator and sense/sustain circuit, both compensation circuits within a sense-sustain circuit within a two-die oscillator, one each within sense/sustain circuit (or bias generator) and on-die or off-die PLL/DLL/ILO/MILO/conditioning circuit, or both within such conditioning circuit), but with the digital correction circuit or circuit element being digitally controlled/adjusted. The $C_a(T)$ and $C_d(T)$ signals delivered to specific compensation points may be transposed, along with the analog and digital character of the underlying compensation circuits. In the digital SPC embodiment 411 of FIG. 6D, a merged digital control signal $C_{dd}(T)$ is applied to digital compensation circuitry within the sense/sustain circuitry in a circuit die of a two-die oscillator or to a digitally controlled PLL (integer-N or fractional-N within the circuit die of the two-die oscillator or a separate circuit die) and, though not specifically shown, may also be applied to a digitally-controlled resonator bias generator. All digital DPC embodiments may also be implemented, with two different digitally controlled compensation circuits (e.g., in bias generator, sense/sustain circuitry, and/or post-oscillator conditioning circuitry (e.g., PLL, DLL, ILO, MILO, etc.). As discussed below, digital compensation circuits may be implemented in numerous ways according to the function performed (e.g., digitally configured resistor bank and/or capacitor bank within bias generator or sense/sustain circuit, digitally controlled integer-N PLL, digitally controlled fractional-N PLL, etc.).

Figure 7B:
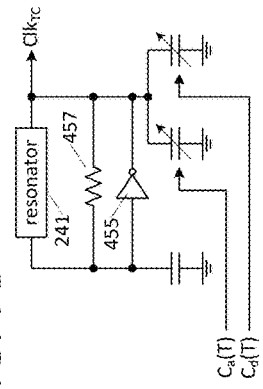
FIGS. 7A, 7B and 7C illustrate embodiments of resonator-based oscillators having digitally-controlled and/or analog-controlled frequency compensation circuits.
Figure 7A:
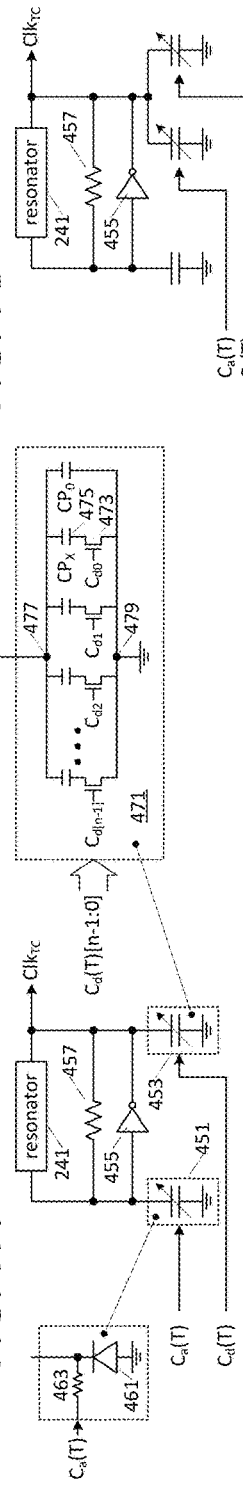
Figure 7C:
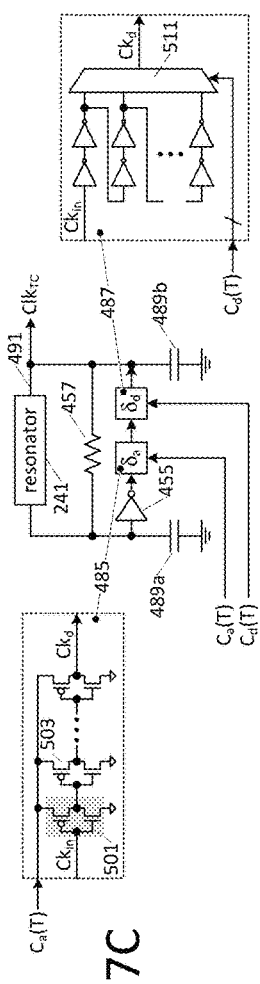

FIGS. 7A, 7B and 7C illustrate embodiments of resonator-based oscillators having digitally-controlled and/or analog-controlled frequency compensation circuits. In FIG. 7A, capacitive elements 451 and 453 within a Pierce oscillator configuration (i.e., having resonator 241, inverting amplifier 455 and biasing resistance 457—various other oscillator arrangements may be used) are varied according to incoming analog and digital control signals to trim/adjust the resonator frequency and thus produce temperature-compensated clock signal $Clk_{TC}$. In the embodiment shown, capacitive element 451 constitutes an analog frequency-compensation element implemented, for example, by a varactor diode 461 and biasing resistor 463—an arrangement that exhibits a capacitance in accordance with the $C_a(T)$ signal applied to the bias port (i.e., terminal of bias resistor 463 opposite its connection to varactor diode 461). Capacitive element 453, by contrast, is a digital frequency-compensation element that may be implemented, for example, by the branched capacitor arrangement shown at 471. In that case, bits of the digital compensation signal, $C_d(T)$ are applied to respective switching elements (e.g., MOS transistors 473) within respective capacitive-element (475) branches to enable the net capacitance between nodes 477 and 479 to be digitally configured. In one embodiment, the capacitive elements in respective branches (which may themselves be implemented by MOS or PN junctions) have binary-weighted capacitances to enable a variable, quantized capacitance between $CP_0$ (minimum capacitance) and $CP_0 + (2^n-1)*CP_x$ in n quantized steps (where 'n' is the bit depth of the digital compensation value, $C_d(T)$, and $CP_x$ is the smallest capacitance of the transistor-switched branches). Uniform capacitances may alternatively be implemented within the transistor-switched branches, or thermometer-coded capacitances or any other practicable switched-capacitance weighting. Also, the connection points of analog compensation element 451 and digital compensation element 453 (e.g., varactor and switched capacitor bank, respectively) may be reversed in alternative embodiments. Further, both compensation elements, analog and digital, may be coupled to the same node coupled to output or input of inverting amplifier element 455 and thus to either side of biasing resistor 457. FIG. 7B illustrates an example of such single-node, dual correction point arrangement with both variable-capacitance elements coupled to the output of inverting amplifier 455.

FIG. 7C illustrates an embodiment of an oscillator having analog and digital adjustable-delay frequency compensation circuits (or circuit elements) 485 and 487. In the particular implementation shown (Pierce oscillator arrangement having resonator 241, inverting amplifier 455, biasing resistor 457 and capacitive load elements 489a/489b—various other oscillator embodiments practicable with same or similar compensation elements), both frequency compensation elements are coupled between the output of inverting amplifier 455 and resonator 241 and introduce adjustable phase delays that force a resonator frequency shift (and thus adjust the frequency of $Clk_{TC}$ as necessary to zero the round-loop phase. In a number of embodiments, the phase delay through either or both of delay elements 485 and 487 exceeds one or more oscillation periods of resonator 241 by a fraction-of-cycle interval, δ, with that fractional interval varying according to an incoming analog or digital control signal to increase or decrease the phase offset between output of amplifier 455 and resonator sense node 491 and thereby shift the resonator frequency ($Clk_{TC}$). In alternative embodiments, either or both of the adjustable-delay elements may be disposed between resonator 241 and the input to amplifier 455.

In the specific embodiment depicted in FIG. 7C, analog-adjust delay element 485 is implemented by a current-starved inverter chain—a daisy-chained set of inverters 501 (e.g., an even number of inverters 501 if signal inversion is occur within amplifier 455 or an odd number otherwise) having a $C_a(T)$ dependent input-to-output delay (e.g., slew rate according to analog voltage applied to source terminals of PMOS transistors 503). Though single-ended delay control is depicted, a differential $C_a(T)$ signal may be applied to the source terminals of both the PMOS and NMOS transistors within each inverter (e.g., $C_a(T)+$ applied to source terminals of PMOS transistors and $C_a(T)-$ applied to source terminals of NMOS transistors) in alternative embodiments. Also, $C_a(T)$ may be applied in the form of an adjustable current to control the delay through individual inverters and thus through the chain as a whole (i.e., current-controlled delay line instead of or in addition to voltage-controlled delay line), or two gates of additional transistors coupled between inverter power rails (e.g., to adjust the net voltage applied at the source terminals of depicted PMOS and NMOS transistors or either one of those transistors), etc.

Still referring to FIG. 7C, a digitally controlled delay line may be effected by digitally setting the current or voltage applied to a delay line (e.g., bank of current sources digitally switched in parallel), through digital selection of the delay path length as shown at 487 (i.e., multiplexer 511 selecting the clock-output tap within an inverter chain in accordance with $C_d(T)$), and so forth. Numerous other delay implementations may be achieved including, for example and without limitation, digital or analog control of variable capacitance (varactor, capacitor bank) and/or RC network at the output of an analog buffer or delay line, chain of inverters/delay elements having propagation delay according to an analog or digital signal, a digitally switched bank of analog-control varactors, etc. More generally, any practicable circuit that enables signal-controlled delay and/or phase change may be deployed as the digitally-controlled or analog-control frequency compensation circuit or circuit element.

Figure 8:
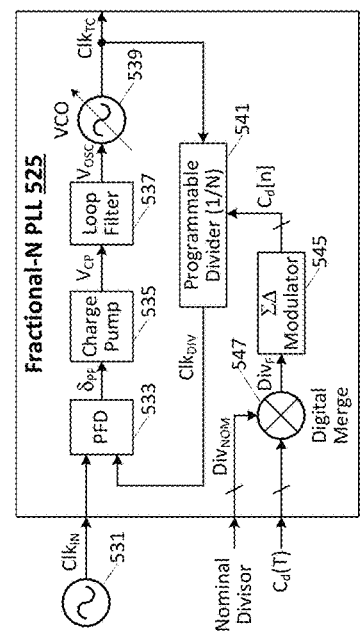
FIG. 8 illustrates a post-oscillator frequency compensation approach within a digitally-controlled fractional-N phase-locked loop.

FIG. 8 illustrates post-oscillator frequency compensation within a digitally-controlled fractional-N PLL 525. As shown, a resonator-based oscillator or other clock generating circuit 531 supplies an input clock signal ($Clk_{IN}$—which may itself be partially temperature-compensated via analog and/or digital temperature compensation paths) to a phase-frequency detector 533 which also receives a frequency-divided feedback clock, $Clk_{DIV}$. Phase-frequency detector 533 generates a bang-bang or proportional phase/frequency error signal ($\delta_{PF}$—indicative of a phase and/or frequency difference between $Clk_{IN}$ and $Clk_{DIV}$) that is applied within charge pump 535 to raise or lower (adjust or servo) an unfiltered control voltage, $V_{CP}$. $V_{CP}$ is filtered within loop filter 537 to yield oscillator control voltage $V_{OSC}$ which is applied, in turn, to a voltage controlled oscillator 539 (VCO) to effect a variable-frequency, temperature-compensated, output clock signal ($Clk_{TC}$). That is, VCO 539 generates $Clk_{TC}$ at a frequency according to control voltage $V_{OSC}$.

Still referring to FIG. 8, $Clk_{TC}$ is fed back to a programmable divider 541 which effects a fractional division (dividing by fractional value N) to yield $Clk_{DIV}$. In this negative-feedback approach, the PLL iteratively adjusts the frequency of $Clk_{TC}$ (i.e., by adjusting VOSC) in response to phase/frequency error $\delta_{PF}$ to achieve frequency and phase alignment with N*$Clk_{IN}$—conceptually $Clk_{TC}$/N≈$Clk_{IN}$, so that $Clk_{IN}$≈$Clk_{TC}$*N. In the depicted embodiment, programmable divider 541 effects a series of integer division operations using a time-varying integer divisor $C_d[n]$ that, over a given sample interval or population interval, averages to the desired fractional divisor, N. Sigma-delta modulator 545 generates $C_d[n]$ based on a fractional divisor input ($Div_F$), effectively scattering the fractional divisor into a time-sequence of $C_d[n]$ integer values that average, within a predefined time interval (population interval or sample interval), to the $Div_F$ fraction. As a simple example, sigma-delta modulator 545 may respond to a fractional divisor of 15.5 by generating a sequence of integer values having a mean or average that matches the fractional divisor (e.g., any integer sequence containing integers 12, 13, 14, 15, 16, 17, 18 and 19 in equal quantities within the sample interval or population interval). Digital merge element 547 combines a nominal divisor value, $Div_{NOM}$ (e.g., a fixed-point or floating point fractional value representation), with digital compensation signal $C_d(T)$ to produce fractional divisor $Div_F$, for example, multiplying the nominal divisor by the compensation signal (e.g., $C_d(T)=1+\Delta F$) or summing the compensation signal with the divisor value ($C_d(T)=\Delta F$). In a first-order sigma-delta modulator implementation, $Div_F$ is implemented with sufficient precision to reflect the minimum frequency change specified by $C_d(T)$ (e.g., as small as one part per billion, though smaller or larger minimum frequency corrections may be supported). In other embodiments, higher-order sigma-delta modulators may be deployed to reduce the relative magnitudes of the nominal divisor and Cd(T) values and thereby relax the precision required in the output of digital merge circuit 547. More generally, any digitally-controlled PLL, clock multiplying circuitry, fractional divisor circuitry, DLL, etc. capable of imparting a desired frequency correction in response to $C_d(T)$ may be deployed instead of or in combination with fractional-N PLL 525.

FIG. 9 illustrates various component circuit dispositions within a multi-chip timing signal generator 600 having dual-path temperature compensation according to any of the embodiments discussed herein. In the depicted implementation, a resonator die 603 (or substrate, enclosure, etc. having a resonator disposed thereon or therein) and circuit die 605 are interconnected within a multi-die package 601 (e.g., stacked-die or side-by-side-die package with flip-chip, wire-bond or other interconnect arrangement and in which circuit die 605 may perform a structural function with respect to the resonator die, such as sealing/covering a chamber containing the resonant member) and optionally connected to another circuit die 611 having one or more constituent elements of timing signal generator 600. A temperature sensitive element (TSE), thermally coupled to the resonator (RES), may be disposed within resonator die 603 and/or circuit die 605 (the alternative dispositions being indicated by dashed outline of that element). Downstream clock generation components, including a temperature signal generator (TSG), dual-path compensation signal generator (CSG, including analog compensation signal generator, ACG, and digital compensation signal generator, DCG) and frequency compensation circuit (FCC), each of which may be implemented by any of the variants discussed herein, may be disposed in whole or part on either of the two circuit dies 605 and 611. Circuit die 611 may be omitted (at least from the standpoint of timing signal generator 600) if components shown therein are disposed within oscillator package 601.

The various circuits and structures disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits and structures. Such representation or image can thereafter be used in device fabrication, for example, by enabling generation of one or more masks that are used to form various components of the circuits/structures in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific materials, quantities, temperatures, time periods, signal levels or types, frequencies, frequency-stability ranges or objectives, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A timing signal generator comprising:
   a resonator;
   one or more temperature-sense circuits to generate an analog temperature signal and a digital temperature signal indicative of temperature of the resonator;
   first and second temperature compensation signal generators to generate, respectively, an analog temperature compensation signal according to the analog temperature signal and a digital temperature compensation signal according to the digital temperature signal; and
   clock generating circuitry to drive the resonator into mechanically resonant motion and to generate a temperature-compensated output timing signal based on the mechanically resonant motion, the analog temperature compensation signal and the digital temperature compensation signal;
   wherein the clock generating circuitry comprises a phase-locked loop (PLL), and wherein an element within the phase-locked loop is to be varied in a manner dependent on the digital temperature compensation signal to shift operation of the PLL, and correspondingly vary the temperature-compensated output timing signal.

2. The timing signal generator of claim 1 wherein the resonator exhibits a natural resonant frequency having linear and nonlinear temperature dependence, and wherein the clock generating circuitry to generate the temperature-compensated output timing signal predominantly compensates for the linear temperature dependence based on the analog temperature compensation signal.

3. The timing signal generator of claim 2 wherein the timing signal generator compensates the nonlinear temperature dependence based at least in part on the digital temperature compensation signal.

4. The timing signal generator of claim 1 wherein the resonator exhibits a temperature-dependent natural resonant frequency, and wherein the clock generating circuitry to generate the temperature-compensated output timing signal implements a coarse compensation for the temperature-dependence of the natural frequency based on the analog temperature compensation signal and implements a fine compensation for the temperature-dependence of the natural frequency based on the digital temperature compensation signal.

5. The timing signal generator of claim 1 wherein the one or more temperature-sense circuits comprises at least one of (i) a temperature-to-analog converter to generate the analog temperature signal and a temperature-to-digital converter to generate the digital temperature signal independently of the analog temperature signal, (ii) a temperature-to-analog converter to generate the analog temperature signal and an analog-to-digital converter to generate the digital temperature signal based on the analog temperature signal, or (iii) a temperature-to-digital converter to generate the digital temperature signal and a digital-to-analog converter to generate the analog temperature signal based on digital temperature signal.

6. The timing signal generator of claim 1 wherein the resonator comprises a microelectromechanical system (MEMS) resonant member implemented in a first semiconductor die and the clock generating circuit is implemented at least in part in a second semiconductor die.

7. The timing signal generator of claim 6 wherein the one or more temperature-sense circuits comprise at least one of a MEMS thermistor implemented in the first semiconductor die or an additional MEMS resonant member implemented in the first semiconductor die.

8. The timing signal generator of claim 1 wherein the clock generating circuitry to drive the resonator into mechanically resonant motion and to generate the temperature-compensated output timing signal comprises a first frequency compensation circuit to frequency-adjust the temperature-compensated output timing signal, the first frequency compensation circuit having a first circuit element to which at least the analog temperature compensation signal is applied to effect at least one of a capacitance of the first circuit element within a continuous capacitance range or a propagation delay through the first circuit element within a continuously variable propagation-delay range.

9. The timing signal generator of claim 1 wherein the analog temperature compensation signal is applied at a first output timing signal correction point, outside of the PLL, to continuously vary timing provided by the temperature-compensated output timing signal, and wherein the element within the PLL represents a second output timing signal correction point, inside of the PLL.

10. The timing signal generator of claim 1 wherein the analog temperature compensation signal is to be applied to control a continuously variable capacitance or delay element within the PLL, to shift operation of the PLL.

11. A method of operation within a timing signal generator having a resonator:
generating an analog temperature signal and a digital temperature signal indicative of temperature of the resonator;
generating an analog temperature compensation signal according to the analog temperature signal and a digital temperature compensation signal according to the digital temperature signal;
driving the resonator into mechanically resonant motion; and
generating a temperature-compensated output timing signal based on the mechanically resonant motion, the analog temperature compensation signal and the digital temperature compensation signal;
wherein generating the temperature-compensated output timing signal comprises varying an element without a phase-locked loop (PLL) in a manner dependent on the digital temperature compensation signal, so as to shift operation of the PLL and correspondingly vary the temperature-compensated output timing signal.

12. The method of claim 11 wherein the resonator exhibits a natural resonant frequency having linear and nonlinear temperature dependence, and wherein generating the temperature-compensated output timing signal comprises compensating for the linear temperature dependence based predominantly on the analog temperature compensation signal.

13. The method of claim 12 wherein further comprising compensating for the nonlinear temperature dependence based at least in part on the digital temperature compensation signal.

14. The method of claim 11 wherein the resonator exhibits a temperature-dependent natural resonant frequency, and wherein generating the temperature-compensated output timing signal comprises coarsely compensating for the temperature-dependence of the natural frequency based on the analog temperature compensation signal and finely compensating for the temperature-dependence of the natural frequency based on the digital temperature compensation signal.

15. The method of claim 11 wherein generating the analog temperature signal and the digital temperature signal comprises at least one of (i) generating the analog temperature signal within a temperature-to-analog converter and independently generating the digital temperature signal within a temperature-to-digital converter, (ii) generating the analog temperature signal within a temperature-to-analog converter and performing analog-to-digital conversion of the analog temperature signal to yield the digital temperature signal, or (iii) generating the digital temperature signal within a temperature-to-digital converter and performing digital-to-analog conversion of the digital temperature signal to yield the analog temperature signal.

16. The method of claim 11 wherein the resonator comprises a microelectromechanical system (MEMS) resonant member implemented in a first semiconductor die and wherein generating the analog temperature signal and the digital temperature signal indicative of temperature of the resonator comprises generating one or more of the analog temperature and the digital temperature based at least in part on resistance of a MEMS thermistor implemented in the first semiconductor die.

17. The method of claim 11 wherein:
the resonator comprises a first microelectromechanical system (MEMS) resonant member implemented in a first semiconductor die;
a second MEMS resonant member is also implemented in the first semiconductor die; and
generating the analog temperature signal and the digital temperature signal indicative of temperature of the resonator comprises generating one or more of the analog temperature and the digital temperature based at least in part on comparison of frequencies of the first and second MEMS resonant members.

18. The method of claim 11 wherein generating the temperature-compensated output timing signal comprises applying at least the analog temperature compensation signal to a first circuit element within a frequency compensation circuit to effect at least one of a capacitance of the first circuit element within a continuous capacitance range or a propagation delay through the first circuit element within a continuously variable propagation-delay range.

19. The method of claim 11 wherein the method further comprises applying the analog temperature compensation signal at a first output timing signal correction point, outside of the PLL, to continuously vary timing provided by the temperature-compensated output timing signal, and wherein the element within the PLL represents a second output timing signal correction point, inside of the PLL.

20. The method of claim 11 further comprising using the analog temperature compensation signal to control a continuously variable capacitance or delay element within the PLL, to shift operation of the PLL.

21. A timing signal generator comprising:
a resonator;
means for generating an analog temperature signal and a digital temperature signal indicative of temperature of the resonator;
means for generating an analog temperature compensation signal according to the analog temperature signal and a digital temperature compensation signal according to the digital temperature signal;
means for driving the resonator into mechanically resonant motion; and
means for generating a temperature-compensated output timing signal based on the mechanically resonant motion, the analog temperature compensation signal and the digital temperature compensation signal;
wherein the means for generating the temperature-compensated output timing signal comprises means for varying an element within a phase-locked loop (PLL) manner dependent on the digital temperature compensation signal, to shift operation of the PLL and correspondingly vary the temperature-compensated output timing signal.

* * * * *